United States Patent
Chang et al.

(10) Patent No.: US 10,930,629 B2
(45) Date of Patent: Feb. 23, 2021

(54) PIXEL, DISPLAY DEVICE INCLUDING THE SAME, AND MANUFACTURING METHOD THEREOF

(71) Applicant: Samsung Display Co., Ltd., Yongin-Si (KR)

(72) Inventors: Chongsup Chang, Hwaseong-si (KR); Bumsoo Kam, Yongin-si (KR); Hyunae Kim, Seoul (KR); Euikang Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/519,433

(22) Filed: Jul. 23, 2019

(65) Prior Publication Data

US 2020/0144239 A1 May 7, 2020

(30) Foreign Application Priority Data

Nov. 5, 2018 (KR) .......................... 10-2018-0134120

(51) Int. Cl.
G02F 1/1343 (2006.01)
G02F 1/1333 (2006.01)
(Continued)

(52) U.S. Cl.
CPC .... H01L 25/167 (2013.01); H01L 31/035227 (2013.01); H01L 31/035272 (2013.01);
(Continued)

(58) Field of Classification Search
CPC ............. H01L 27/3276; H01L 27/3244; H01L 27/3246; H01L 27/3258; H01L 27/124; H01L 27/32; H01L 27/3248; H01L 51/5253; H01L 51/0097; H01L 51/5012; H01L 51/50; H01L 51/5203; H01L 2251/5338; H01L 33/405; H01L 33/06; H01L 33/26; H01L 33/60; H01L 33/18; H01L 33/42; H01L 25/167; H01L 2924/13069; H01L 29/78666;
(Continued)

(56) References Cited

U.S. PATENT DOCUMENTS 9,190,590 B2    11/2015  Shibata et al.
2014/0367646 A1*  12/2014  Kim .................... H01L 27/3246
                                                    257/40
(Continued)

FOREIGN PATENT DOCUMENTS

KR    10-2015-0098246 A    8/2015
KR    10-2018-0007025 A    1/2018
KR    10-2020-0004936 A    1/2020

*Primary Examiner* — Thoi V Duong
(74) *Attorney, Agent, or Firm* — Lewis Roca Rothgerber Christie LLP

(57) ABSTRACT

Provided is a pixel. The pixel includes a substrate, a first electrode disposed on the substrate, a partition wall insulation layer disposed on the substrate to cover a first portion of the first electrode, a second electrode disposed on the partition wall insulation layer and including a second portion overlapping the first portion, and a light emitting element disposed on a first side surface of the partition wall insulation layer between the first portion and the second portion and connected to the first electrode and the second electrode.

15 Claims, 12 Drawing Sheets

(51) Int. Cl.
*H01L 25/16* (2006.01)
*H01L 33/42* (2010.01)
*H01L 33/40* (2010.01)
*H01L 31/0352* (2006.01)
*H01L 33/06* (2010.01)
*H01L 33/26* (2010.01)
*H01L 33/18* (2010.01)

(52) U.S. Cl.
CPC ............ *H01L 33/06* (2013.01); *H01L 33/405* (2013.01); *H01L 33/42* (2013.01); *G02F 1/133345* (2013.01); *G02F 1/134309* (2013.01); *H01L 33/18* (2013.01); *H01L 33/26* (2013.01)

(58) Field of Classification Search
CPC ..... H01L 31/035227; H01L 31/035272; G02F 1/133305; G02F 1/136286; G02F 1/133512; G02F 1/133514; G02F 1/133553; G02F 1/1368; G02F 1/1335; G02F 1/1343; G02F 1/134309; G02F 1/134336; G02F 1/1362; G02F 2201/123
See application file for complete search history.

(56) References Cited

U.S. PATENT DOCUMENTS

| | | | |
|---|---|---|---|
| 2015/0179978 A1* | 6/2015 | Sato | H01L 51/5209 257/40 |
| 2017/0125740 A1* | 5/2017 | Lee | H01L 51/5218 |
| 2018/0012876 A1 | 1/2018 | Kim et al. | |

* cited by examiner

PIXEL, DISPLAY DEVICE INCLUDING THE SAME, AND MANUFACTURING METHOD THEREOF

CROSS-REFERENCE TO RELATED APPLICATIONS

This U.S. non-provisional patent application claims priority under 35 U.S.C. § 119 of Korean Patent Application No. 10-2018-0134120, filed on Nov. 5, 2018, the entire contents of which are hereby incorporated by reference.

BACKGROUND

The present disclosure herein relates to a pixel, a display device including the same, and a manufacturing method thereof.

Generally, a display device includes a plurality of pixels for displaying an image. Different types of pixels such as a pixel including a liquid crystal layer, a pixel including an electrowetting layer, a pixel including an electrophoretic layer, and a pixel including a light emitting element are used for displaying an image. Among them, a light emitting element may emit light by itself, and a display device including a light emitting element does not require a separate light source.

Recently, as a light emitting element, an ultra-small LED element is under development. The ultra-small LED element is manufactured in nano or micro units and has a rod-like or bar-like shape. The ultra-small LED elements are horizontally arranged and electrically connected to two electrodes having opposite polarities.

With the development of technology, high resolution of display devices is required. However, since the ultra-small LED elements are horizontally arranged, a space for arranging the ultra-small LED elements should be ensured. Therefore, there is a limitation in realizing a high resolution of the display device.

SUMMARY

The present disclosure is to provide to a pixel capable of realizing a high resolution, a display device including the same, and a manufacturing method thereof.

An embodiment of the inventive concept provides a pixel including: a substrate; a first electrode disposed on the substrate; a partition wall insulation layer disposed on the substrate to cover a first portion of the first electrode; a second electrode disposed on the partition wall insulation layer and including a second portion overlapping the first portion; and a light emitting element disposed on a first side surface of the partition wall insulation layer between the first portion and the second portion and connected to the first electrode and the second electrode.

The pixel may further comprise a partition wall layer disposed between the substrate and the first electrode, wherein the first electrode is disposed on the substrate to cover the partition wall layer.

The pixel may have wherein a section of the partition wall insulation layer has a rectangular shape.

The pixel may have wherein the light emitting element has a cylindrical shape and is vertically arranged in a direction intersecting an upper surface of the substrate.

The pixel may have wherein the first electrode comprises: a first extension part extending in a first direction; and a plurality of first branch parts branched in a second direction intersecting the first direction from the first extension part, wherein the second electrode comprises: a second extension part extending in the first direction; and at least one second branch part branched in the second direction from the second extension part, wherein the second branch part is disposed between the first branch parts.

The pixel may have wherein the first portion comprises: each side of the first branch parts adjacent to one of two sides of the second branch part, the two sides of the second branch part opposite to each other in the first direction; and predetermined portions of the first branch parts adjacent to each side of the first branch parts, wherein the second portion comprises: the two sides of the second branch part; and predetermined portions of the second branch part adjacent to the two sides of the second branch part.

The pixel may have wherein the partition wall insulation layer comprises an inorganic material.

The pixel may have wherein the first electrode comprises a reflective electrode.

The pixel may have wherein the first electrode further comprises a transparent electrode disposed on the reflective electrode.

The pixel may have wherein a lower end of the light emitting element contacts the first electrode, wherein a side surface of an upper portion of the light emitting element, which is defined as a predetermined portion of the light emitting element adjacent to an upper end of the light emitting element, contacts the second portion.

The pixel may further comprise an insulation layer disposed on the first electrode, the second electrode, and the light emitting element, and having a defined opening exposing the upper portion and the second portion of the light emitting element.

The pixel may further comprise a contact electrode disposed in the opening and contacting the upper portion of the light emitting element and the second electrode.

The pixel may further comprise a sub insulation layer disposed between the light emitting element and the partition wall insulation layer, between the light emitting element and the second portion, between the insulation layer and a second electrode, and between the insulation layer and a second side surface of the partition wall insulation layer defined as a side surface of the partition wall insulation layer excluding the first side surface.

The pixel may have wherein the first side surface is inclined surface that makes a predetermined inclination angle with respect to an upper surface of the substrate.

In an embodiment of the inventive concept, a display device includes a plurality of pixels, wherein each of the plurality of pixels includes: a substrate; a first electrode disposed on the substrate; a partition wall insulation layer disposed on the substrate to cover a first portion of the first electrode; a second electrode disposed on the partition wall insulation layer and including a second portion overlapping the first portion; and a light emitting element disposed on a first side surface of the partition wall insulation layer between the first portion and the second portion and connected to the first electrode and the second electrode.

In an embodiment of the inventive concept, a method of manufacturing a pixel includes: providing a partition wall layer on a substrate; providing a first electrode on the substrate to cover the partition wall layer; providing a partition wall insulation layer disposed on the substrate being spaced apart from the partition wall layer to cover a first portion of the first electrode; providing a second electrode disposed on the partition wall insulation layer and including a second portion overlapping the first portion; providing a light emitting element between the partition wall layer and the partition wall insulation layer; and applying voltages of opposite polarities to the first electrode and the second electrode to provide the light emitting element on a first side surface of the partition wall insulation layer between the first portion and the second portion, wherein the light emitting element is connected to the first electrode and the second electrode.

The method may have wherein a lower end of the light emitting element contacts the first electrode, wherein a side surface of an upper portion of the light emitting element, which is defined as a predetermined portion of the light emitting element adjacent to an upper end of the light emitting element, contacts the second portion.

The method may further comprise: providing an insulation layer on the substrate to cover the first electrode, the light emitting element, and the second electrode; removing a portion of the insulation layer overlapping the upper portion and the second portion of the light emitting element; and providing an opening defined as a removed portion of the insulation layer and a contact electrode on the insulation layer adjacent to the opening, wherein the contact electrode contacts the upper portion of the light emitting element and the second electrode.

The method may have wherein the first electrode comprises: a first extension part extending in a first direction; and a plurality of first branch parts branched in a second direction intersecting the first direction from the first extension part, wherein the second electrode comprises: a second extension part extending in the first direction; and at least one second branch part branched in the second direction from the second extension part, wherein the second branch part is disposed between the first branch parts, wherein the first portion comprises: each side of the first branch parts adjacent to one of two sides of the second branch part, the two sides of the second branch part opposite to each other in the first direction; and predetermined portions of the first branch parts adjacent to the two sides of the first branch parts, wherein the second portion comprises: the two sides of the second branch part; and predetermined portions of the second branch part adjacent to the two sides of the second branch part.

The method may have wherein a section of the partition wall insulation layer has a rectangular shape and the light emitting element has a cylindrical shape and is vertically arranged in a direction intersecting an upper surface of the substrate.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
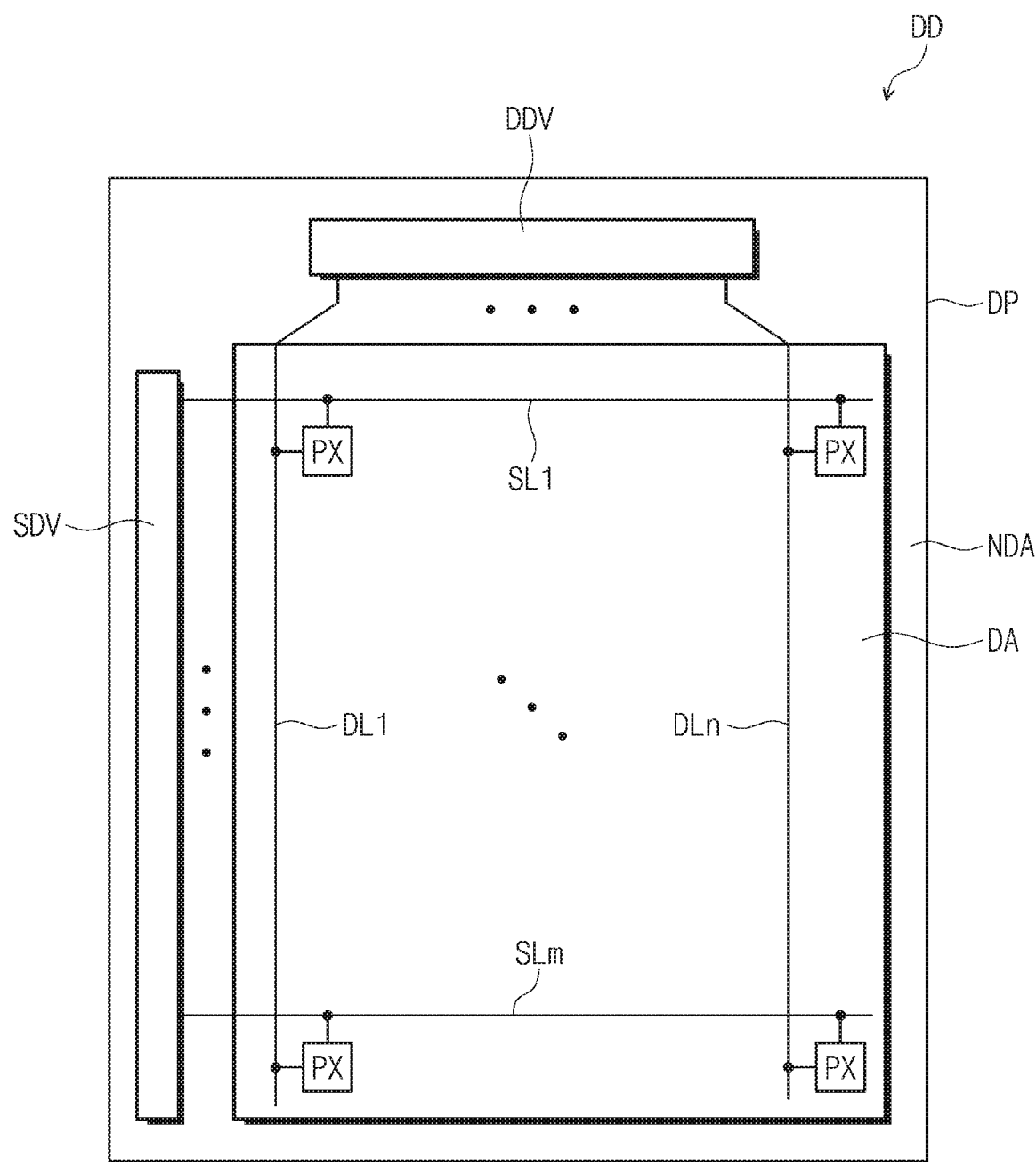
FIG. 1 is a plan view of a display device including a pixel according to an embodiment of the inventive concept.

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as terms commonly understood by those skilled in the art to which this invention belongs. Also, terms such as terms defined in commonly used dictionaries should be interpreted as having meaning consistent with meaning in the context of the related art, and unless the term is interpreted in an ideal or overly formal sense, they are explicitly defined here.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept are described in more detail with reference to the accompanying drawings.

FIG. 1 is a plan view of a display device including a pixel according to an embodiment of the inventive concept.

Referring to FIG. 1, a display device DD according to an embodiment of the inventive concept may include a display panel DP, a scan driver SDV, and a data driver DDV. The scan driver SDV and the data driver DDV may be disposed on the display panel DP.

The display panel DP may have a rectangular shape having short sides in a first direction DR1 and long sides in a second direction DR2 intersecting the first direction DR1. However, the inventive concept is not limited to this, and the shape of the display panel DP may have various shapes such as a circular shape and a polygonal shape.

The planar area of the display panel DP may include a display area DA and a non-display area NDA surrounding the display area DA. The display area DA may be an area for displaying an image, and the non-display area NDA may be an area not for displaying an image.

The display panel DP may include a plurality of pixels PX, a plurality of scan lines SL1 to SLm, and a plurality of data lines DL1 to DLn. m and n are natural numbers. Illustratively, the pixels PX may be arranged in a matrix form, but the arrangement form of the pixels PX is not limited thereto.

The pixels PX may be disposed in the display area DA and connected to the scan lines SL1 to SLm and the data lines DL1 to DLn. Each of the pixels PX may include a light emitting element for displaying an image.

The scan driver SDV and the data driver DDV may be disposed in the non-display area NDA. The scan driver SDV may be disposed in the non-display area NDA adjacent to one of the long sides of the display panel DP. The data driver DDV may be disposed in the non-display area NDA adjacent to one of the short sides of the display panel DP. The data driver DDV may be fabricated in the form of an integrated circuit chip and mounted on the display panel DP.

The scan lines SL1 to SLm may each extend in the first direction DR1 and may be connected to the scan driver SDV. The data lines DL1 to DLn each extend in the second direction DR2 and may be connected to the data driver DDV.

The scan driver SDV generates a plurality of scan signals, and the scan signals may be applied to the pixels PX through the scan lines SL1 to SLm. The scan signals may be sequentially applied to the pixels PX. The data driver DDV generates a plurality of data voltages, and the data voltages may be applied to the pixels PX through the data lines DL1 to DLn.

Although not shown in the drawings, the display device DD may include a timing controller for controlling the operation of the scan driver SDV and the data driver DDV. The timing controller may generate a scan control signal and a data control signal in response to externally received control signals. The timing controller receives the image signals from the outside, and converts the data format of the image signals to match the interface specification with the data driver DDV, and provides the converted image data to the data driver DDV.

The scan driver SDV may generate scan signals in response to the scan control signal. The data driver DDV is provided with the image signals whose data format is converted, and may generate the data voltages corresponding to the image signals in response to the data control signal.

The pixels PX may be provided with the data voltages in response to the scan signals. The pixels PX may display an image by emitting light of a luminance corresponding to the data voltages.

Figure 2:
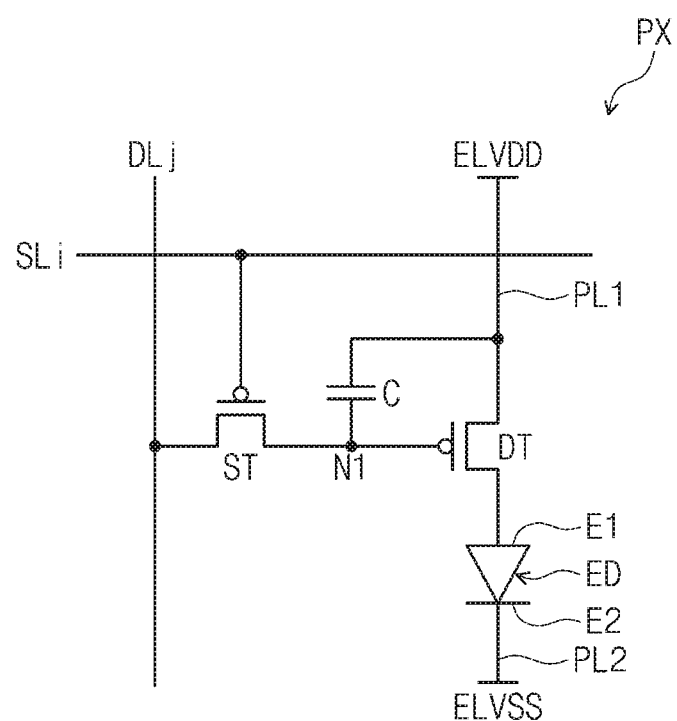
FIG. 2 is an equivalent circuit diagram of a pixel shown in FIG. 1.

FIG. 2 is an equivalent circuit diagram of a pixel shown in FIG. 1.

Although an equivalent circuit diagram of one pixel PX of the pixels PX shown in FIG. 1 is shown in FIG. 2, other pixels PX shown in FIG. 1 may each have the same circuit diagram as the pixel PX shown in FIG. 2. Illustratively, a pixel PX connected to the scan line SLi and the data line DLj is shown in FIG. 2. i and j are natural numbers.

Referring to FIG. 2, the pixel PX may include a light emitting element ED, a driving element DT, a capacitance element C, and a switching element ST. A plurality of light emitting elements ED may be provided. A plurality of light emitting elements ED will be shown in FIG. 3 below.

The driving element DT and the switching element ST may be P-type transistors. However, the inventive concept is not limited thereto, and the driving element DT and the switching element ST may be N-type transistors. The capacitance element C may be a capacitor.

The driving element DT includes an input terminal connected to the first cap electrode of the capacitance element C and the first power supply line PL1, an output terminal connected to the light emitting element ED, and a control terminal connected to the output terminal of the switching element ST. The driving element DT may receive the first power supply voltage ELVDD through the first power supply line PL1. The second cap electrode of the capacitance element C may be connected to the control terminal of the driving element DT.

The switching element ST may include an input terminal connected to the data line DLj, an output terminal connected to the control terminal of the driving element DT, and a control terminal connected to the scan line SLi.

The light emitting element ED may be connected to the driving element DT and the second power supply line PL2. For example, the light emitting element ED may be connected to the first electrode E1 electrically connected to the driving element DT and the second electrode E2 connected to the second power supply line PL2. The light emitting element ED may receive the second power supply voltage ELVSS through the second power supply line PL2. The second power supply voltage ELVSS may be a voltage having a level lower than the first power supply voltage ELVDD.

A scan signal is applied to the control terminal of the switching element ST through the scan line SLi and the switching element ST may be turned on in response to the scan signal. The turned-on switching element ST may provide the data voltage, which is received through the data line DLj, to the first node N1.

The capacitance element C may charge the amount of charge corresponding to the difference between the data voltage provided to the first node N1 and the first power supply voltage ELVDD and maintain it even after the switching element ST is turned off.

The driving element DT may be turned on according to the amount of charge charged in the capacitance element C. The turn-on time of the driving element DT may be determined according to the amount of charge charged in the capacitance element C. A light emitting element ED may be provided with a current through a turned-on driving element DT so that the light emitting element ED emits light. The light emitting element ED may emit light to generate an image.

The light emitting element ED may be an ultra-small LED element. The ultra-small LED device may be an LED device having a length of several nanometers to several hundreds of micrometers. The length of the ultra-small LED element is merely an example, and the length of the ultra-small LED element is not limited to the above numerical range.

Figure 3:
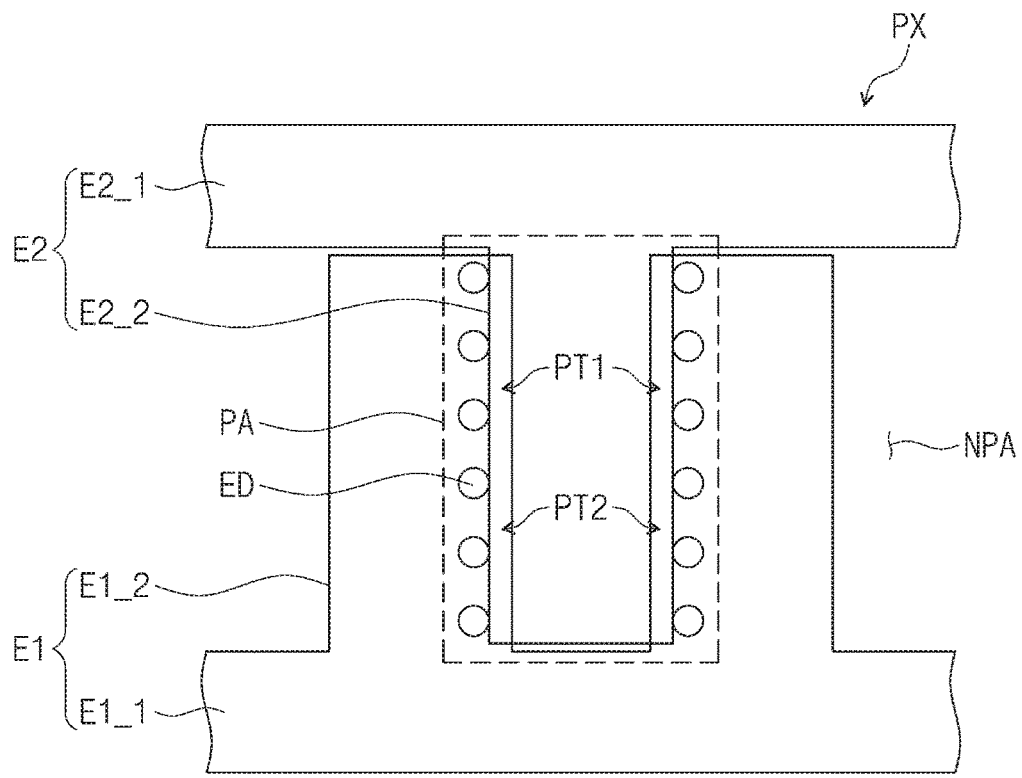
FIG. 3 is a plan view of a first electrode and a second electrode connected to the light emitting element shown in FIG. 2.
Figure 3:
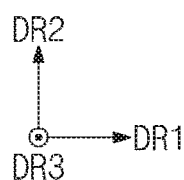

FIG. 3 is a plan view of a first electrode and a second electrode connected to the light emitting element shown in FIG. 2.

Referring to FIG. 3, the first electrode E1 includes a first extension part E1_1 extending in a first direction DR1 and a plurality of first branch parts E1_2 branched from the first extension part E1_1 in a second direction DR2. Although two first branch parts E1_2 are shown illustratively, the number of the first branch parts E1_2 is not limited thereto. For example, one pixel PX may include more than two first branch parts E1_2.

The second electrode E2 may include a second extension part E2_1 extending in the first direction DR1 and a second branch part E2_2 branched in the second direction DR2 from the second extension part E2_1. Illustratively, one second branch part E2_2 is shown, but the inventive concept is not limited thereto, and one pixel PX may include two or more second branch parts E2_2.

The second branch part E2_2 may be disposed between the first branch parts E1_2. When a plurality of second branch parts E2_2 are provided to the second extension part E2_1, the first branch parts E1_2 and the plurality of second branch parts E2_2 may be arranged in a 1:1 alternation along the first direction DR1.

The first electrode E1 and the second electrode E2 may partially overlap each other. The first electrode E1 may include a first portion PT1 overlapping a predetermined portion of the second electrode E2. The second electrode E2 may include a second portion PT2 overlapping a predetermined portion of the first electrode E1.

The first portion PT1 may include each side of the two first branch parts 1_2 adjacent to one of the two sides of the second branch part E2_2 opposite to each other in the first direction DR1 and predetermined portions of the first branch parts 1_2 adjacent to the each side of the first branch parts 1_2. The first portion PT1 may overlap a predetermined portion of the second branch part E2_2.

The second portion PT2 may include the two sides of the second branch part E2_2 and predetermined portions of the second branch part E2_2 adjacent to the two sides of the second branch part E2_2. The second portion PT2 may overlap the predetermined portions of the first branch parts 1_2.

The pixel PX may include a plurality of light emitting elements ED. The direction perpendicular to the plane defined by the first and second directions DR1 and DR2 may be defined as a third direction DR3. When viewed in the third direction DR3, the light emitting elements ED may be disposed on both sides of the second branch part E2_2.

The planar area of the pixel PX may include a pixel area PA and a non-pixel area NPA around the pixel area PA. The light emitting elements ED may be disposed in the pixel area PA.

Figure 4:
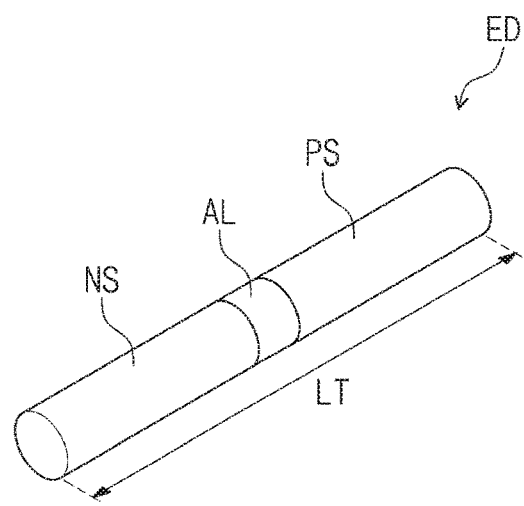
FIG. 4 is a perspective view of one light emitting element shown in FIG. 3.

FIG. 4 is a perspective view of one light emitting element shown in FIG. 3.

Although one light emitting element ED is illustratively shown in FIG. 4, other light emitting elements ED will have the same configuration as the light emitting element ED shown in FIG. 4.

Referring to FIG. 4, the light emitting element ED may have a cylindrical shape. However, the inventive concept is not limited to this, and the light emitting element ED may have a polygonal columnar shape. The light emitting elements ED may be vertically aligned and disposed on both sides of the second branch part E2_2. Therefore, as shown in FIG. 3, when viewed in the third direction DR3, the light emitting element ED may have a circular shape.

The light emitting element may include an n-type semiconductor layer NS, a p-type semiconductor layer PS, and an active layer AL disposed between the n-type semiconductor layer NS and the p-type semiconductor layer PS. The n-type semiconductor layer NS may be formed by doping an n-type dopant into a semiconductor layer. The p-type semiconductor layer PS may be formed by doping a p-type dopant into a semiconductor layer. The semiconductor layer may include a semiconductor material. For example, the semiconductor layer may include GaN, AlN, AlGaN, InGaN, InN, InAlGaN, or AlInN but is not limited thereto.

The n-type dopant may be silicon (Si), germanium (Ge), tin (Sn), selenium (Se), tellurium (Te), or a combination thereof, but is not limited thereto. The p-type dopant may be magnesium (Mg), zinc (Zn), calcium (Ca), strontium (Sr), barium (Ba), or a combination thereof, but is not limited thereto.

The active layer AL may be formed of at least one of a single quantum well structure, a multiple quantum well structure, a quantum wire structure, or a quantum dot structure. The active layer AL may be an area where electrons injected through the n-type semiconductor layer NS and holes injected through the p-type semiconductor layer PS are recombined. The active layer AL may be defined as a layer that emits light with energy determined by the material-specific energy band. The position of the active layer AL may be varied depending on the type of diode.

The n-type semiconductor layer NS may be connected to one of the first electrode E1 and the second electrode E2. The p-type semiconductor layer PS may be connected to the other one of the first electrode E1 and the second electrode E2.

The length LT of the light emitting element ED may be between a few nanometers and a few hundred micrometers. For example, the length LT of the light emitting element ED may be from 1 micrometer to 100 micrometers.

Figure 5:
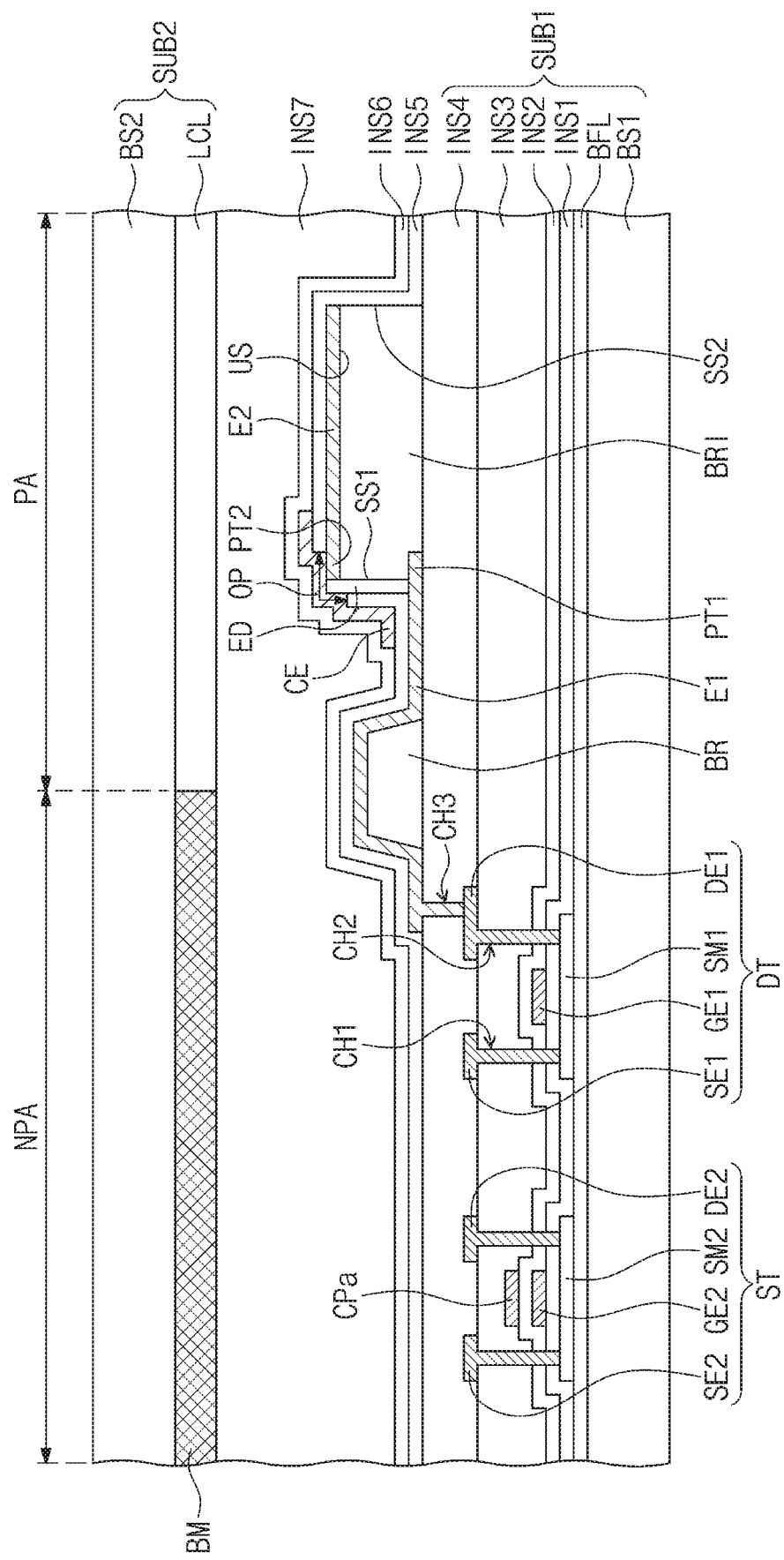
FIG. 5 is a view showing an exemplary cross-section of the pixel shown in FIG. 2.

FIG. 5 is a view showing an exemplary cross-section of the pixel shown in FIG. 2.

Referring to FIG. 5, the pixel PX may include a driving element DT, a switching element ST, a first electrode E1, a second electrode E2, and a light emitting element ED. The driving element DT, the switching element ST, the first and second electrodes E1 and E2, and the light emitting element ED may be disposed on the first base substrate BS1.

The second base substrate BS2 may face the first base substrate BS1. The driving element DT, the switching element ST, the first and second electrodes E1 and E2, and the light emitting element ED may be disposed between the first base substrate BS1 and the second base substrate BS2. The first and second base substrates BS1 and BS2 may each be a silicon substrate, a plastic substrate, a glass substrate, an insulating film, or a laminated structure including a plurality of insulation layers.

Since the configuration of the driving element DT and the configuration of the switching element ST are substantially the same, hereinafter, the configuration of the driving element DT will be mainly described, and the configuration of the switching element ST will be briefly described or omitted.

A buffer layer BFL may be disposed on the first base substrate BS1. The buffer layer BFL may include an inorganic material. The driving element DT and the switching element ST may be disposed on the buffer layer BFL.

The driving element DT may include a first gate electrode GE1, a first source electrode SE1, a first drain electrode DE1, and a first semiconductor layer SM1. The switching element ST may include a second gate electrode GE2, a second source electrode SE2, a second drain electrode DE2, and a second semiconductor layer SM2.

The second gate electrode GE2, the second source electrode SE2, the second drain electrode DE2, and the second semiconductor layer SM2 may have the same structures as the first gate electrode GE1, the first source electrode SE1, the drain electrode DE1, and the first semiconductor layer SM1, respectively, and may be disposed on the same layer.

The first semiconductor layer SM1 may be disposed on the buffer layer BFL. The first semiconductor layer SM1 may include a semiconductor of an inorganic material such as amorphous silicon or poly silicon, or an organic semiconductor. Additionally, the first semiconductor layer SM1 may include an oxide semiconductor. Although not shown in FIG. 5, the first semiconductor layer SM1 may include a source area, a drain area, and a channel area between the source area and the drain area.

The buffer layer BFL may provide a modified surface to the first semiconductor layer SM1. In this case, the first semiconductor layer SM1 may have a higher adhesion to the buffer layer BFL than when placed directly on the first base substrate BS1. The buffer layer BFL may be a barrier layer for protecting the lower surface of the first semiconductor layer SM1. In this case, the buffer layer BFL may prevent the contamination or moisture from the first base substrate BS1 itself or entering through the first base substrate BS1 from penetrating into the first semiconductor layer SM1.

The first insulation layer INS1 may be disposed on the buffer layer BFL so as to cover the first semiconductor layer SM1. The first insulation layer INS1 may include an inorganic material. For example, the first insulation layer INS1 may include silicon nitride, silicon oxynitride, silicon oxide, titanium oxide, or aluminum oxide, but is not limited thereto.

A first gate electrode GE1 overlapping the first semiconductor layer SM1 may be disposed on the first insulation layer INS1. The first gate electrode GE1 may be disposed to overlap the channel area of the first semiconductor layer SM1. The second insulation layer INS2 may be disposed on the first insulation layer INS1 to cover the first gate electrode GE1. The second insulation layer INS2 may include an inorganic material.

The capacitance element C (shown in FIG. 2) may include a first cap electrode (not shown) and a second cap electrode CPa. The first cap electrode may be branched from the second gate electrode GE2 and the second cap electrode CPa may be disposed on the second insulation layer INS2.

The third insulation layer INS3 may be disposed on the second insulation layer INS2 so as to cover the second cap electrode CPa. The third insulation layer INS3 may be defined as an interlayer insulation layer. The third insulation layer INS3 may include an organic material and/or an inorganic material.

The first source electrode SE1 and the first drain electrode DE1 may be spaced apart from each other and disposed on the third insulation layer INS3. The first source electrode SE1 is connected to the source area of the first semiconductor layer SM1 through the first contact hole CH1 defined through the first, second, and third insulation layers INS1, INS2 and INS3. The first drain electrode DE1 is connected to the drain area of the first semiconductor layer SM1 through the second contact hole CH2 defined through the first, second, and third insulation layers INS1, INK and INS3.

A fourth insulation layer INS4 may be disposed on the third insulation layer INS3 to cover the first source electrode SE1 and the first drain electrode DE1 The fourth insulation layer INS4 may be defined as a planarization film that provides a flat upper surface, and may include organic materials.

The layer on which the first base substrate BS1, the buffer layer BFL, and the first to fourth insulation layers INS1 to INS4 are disposed may be defined as the first substrate SUB1.

A partition wall layer BR and a partition wall insulation layer BRI may be disposed apart from each other and disposed on the first substrate SUB1. The partition wall layer BR may include an organic material, and the partition wall insulation layer BRI may include an inorganic material, but is not limited thereto.

The first electrode E1 may be disposed on the first substrate SUB1 to cover the partition wall layer BR. For example, the first electrode E1 may be disposed on the partition wall layer BR and disposed on a portion of the first substrate SUB1 adjacent to the partition wall layer BR. Accordingly, the partition wall layer BR may be disposed between the first substrate SUB1 and the first electrode E1.

The first electrode E1 may be connected to the first drain electrode DE1 through a third contact hole CH3 defined through the fourth insulation layer INS4 of the first substrate SUB1. Accordingly, the first electrode E1 may be electrically connected to the driving element DT.

The first electrode E1 may have a single-layer structure or a multi-layered structure. For example, the first electrode E1 may include a reflective electrode, or may include a reflective electrode and a transparent electrode disposed on the reflective electrode.

The reflective electrode may include copper (Cu), aluminum (Al), and silver (Ag), which may reflect light. The transparent electrode may include at least one of indium zinc oxide (IZO), indium tin oxide (ITO), indium gallium oxide (IGO), indium zinc gallium oxide (IGZO), and a mixture/compound thereof, which may transmit light.

The section wall insulation layer BRI may have a rectangular cross-section. Accordingly, the side surfaces SS1 and SS2 of the partition wall insulation layer BRI may extend in a direction perpendicular to the upper surface of the first substrate SUB1. The upper surface of the first substrate SUB1 may be a plane defined by the first and second directions DR1 and DR2 and the direction perpendicular to the upper surface of the first substrate SUB1 may be the third direction DR3.

The partition wall insulation layer BRI may be disposed on the first substrate SUB1 to cover the first portion PT1 of the first electrode E1. As described above, the first portion PT1 may be a portion of the first electrode E1 overlapping the second electrode E2.

Hereinafter, the side surface of the partition wall insulation layer BRI adjacent to the first portion PT1 and disposed between the first portion PT1 and the second portion PT2 is defined as a first side surface SS1. The side surface of the partition wall insulation layer BRI excluding the first side surface SS1 is defined as a second side surface SS2. The second electrode E2 may be disposed on the upper surface US of the partition wall insulation layer BRI and may not be disposed on the first and second side surfaces SS1 and SS2.

The light emitting element ED may extend in the third direction DR3 and be disposed on the first side surface SS1. The light emitting element ED may contact the first side surface SS1. The light emitting element ED may be electrically connected to the first electrode E1 and the second electrode E2.

The lower end of the light emitting element ED may contact the first electrode E1 to be electrically connected to the first electrode E1. The upper portion of the light emitting element ED, defined as a predetermined portion of the light emitting element ED adjacent to the upper end of the light emitting element ED, contacts the second electrode E2 to be electrically connected to the second electrode E2. The second portion PT2 of the second electrode E2 may contact the upper side surface of the light emitting element ED.

The fifth insulation layer INS5 may be disposed on the first substrate SUB1. The fifth insulation layer INS5 may be disposed on the first electrode E1, the second electrode E2, and the light emitting element ED. An opening OP for exposing the upper portion and second portions PT2 of the light emitting element ED may be defined in the fifth insulation layer INS5. The fifth insulation layer INS5 may include an inorganic material.

The contact electrode CE may be disposed on the opening OP and the fifth insulation layer INS5 adjacent to the opening OP. However, the inventive concept is not limited thereto, and the contact electrode CE may not be disposed on the fifth insulation layer INS5 but may be disposed only on the opening OP. The contact electrode CE may contact the upper portion of the light emitting element ED and the second electrode E2 through the opening OP.

The contact electrode CE may include a transparent material. For example, the contact electrode CE may include at least one of indium zinc oxide (IZO), indium tin oxide (ITO), indium gallium oxide (IGO), indium zinc gallium oxide (IGZO), and a mixture/compound thereof, and is not limited thereto.

Since the lower end of the light emitting element ED has a circular plane, it may be in surface contact with the upper surface of the first electrode E1. However, since the light emitting element ED has a cylindrical shape, the upper side surface of the light emitting element ED may be in line contact with the second portion PT2 as a cylindrical side surface. The line contact has a smaller contact area than the surface contact, and as the contact area is smaller, the contact resistance may be larger. The resistance may interfere with the flow of current.

The upper end of the light emitting element ED having a circular plane may be electrically connected to the second portion PT2 through the contact electrode CE. That is, substantially, the contact area may be increased by the contact electrode CE so that the contact resistance between the light emitting element ED and the second electrode E2 may be reduced.

A sixth insulation layer INS6 may be disposed on the fifth insulation layer INS5 to cover the contact electrode CE. The sixth insulation layer INS6 may be a sealing layer.

The light conversion layer LCL and the black matrix BM may be disposed on one surface of the second base substrate BS2 facing the first base substrate BS1. The light conversion layer LCL may be disposed in the pixel area PA and the black matrix BM may be disposed in the non-pixel area NPA. Some pixels PX may not include a light conversion layer LCL.

The light conversion layer LCL may include an emitter. For example, the emitter may convert the wavelength of the first color light provided from the light emitting element ED to emit the second color light having a different color from the first color light. The emitter may be a quantum dot. The first color light may be blue light, and the second color light may be red light or green light.

Pixels PX including the light conversion layer LCL for converting blue light into red light, pixels PX including the light conversion layer LCL for converting blue light into green light, and pixels PX not including the light conversion layer LCL may be disposed on the display panel DP. Thus, red, blue, and green lights may be generated by the pixels PX.

However, the embodiment of the inventive concept is not limited thereto. For example, the light conversion layer LCL may be replaced with a color filter. Also, the light conversion layer LCL may be omitted from the pixels PX. In this case, the light emitting element ED may emit blue light, green light, or red light. The black matrix BM may prevent light leakage between the pixels.

The layer on which the second base substrate BS2, the light conversion layer LCL, and the black matrix BM are disposed may be defined as a second substrate SUB2.

A seventh insulation layer INS7 may be disposed between the first substrate SUB1 and the second substrate SUB2. The seventh insulation layer INS7 may be an optically clear adhesive film, an optically clear adhesive resin, or a pressure sensitive adhesive film. However, this is only an example, and in another embodiment of the inventive concept, the seventh insulation layer INS7 may be omitted.

In an embodiment of the inventive concept, the light emitting element ED may be arranged vertically and connected to the first and second electrodes E1 and E2. Therefore, the arrangement area of the light emitting element ED may be reduced compared to when the light emitting elements ED are arranged horizontally. Since the arrangement area of the light emitting element ED may be reduced, a larger number of light emitting elements ED may be provided to the display device DD. As a result, a high resolution of the display device DD may be realized.

FIGS. 6 to 18 are views for explaining a method of manufacturing a pixel according to an embodiment of the inventive concept.

For convenience of explanation, FIGS. 6 to 18 show a portion of a partition wall layer BR and a section of a partition wall insulation layer BRI. In addition, the first substrate SUB1 is not divided into the first base substrate BS1, the buffer layer BFL, and the first to fourth insulation layers INS1 to INS4, but is shown as a single layer. The second substrate SUB2 and the seventh insulation layer INS7 are omitted.

Figure 6:
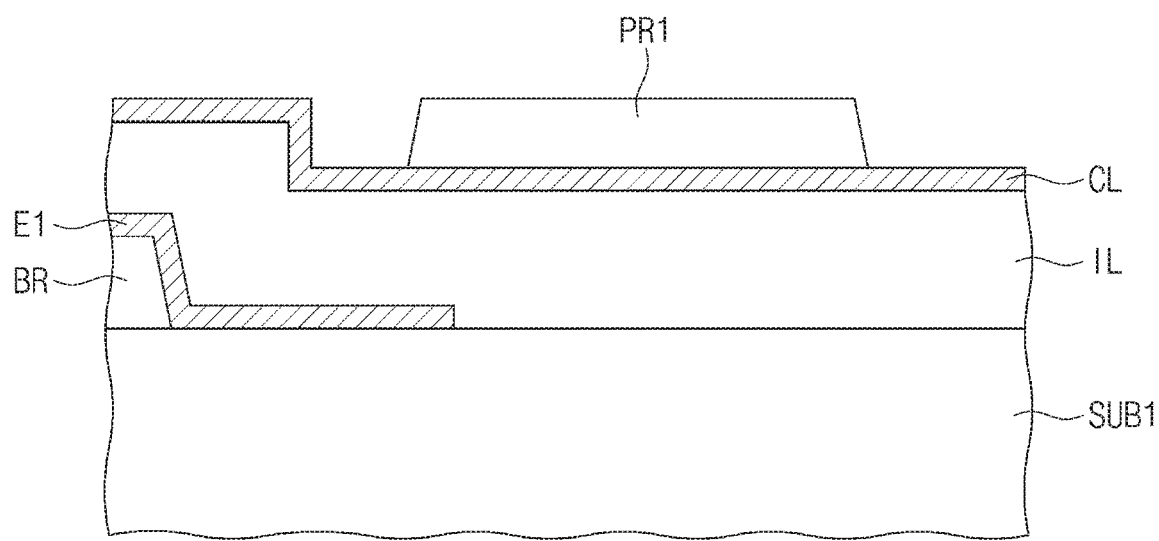
FIGS. 6, 7, 8, 9, 10, 11, 12, 13, 14, 15, 16, 17, and 18 are views for explaining a method of manufacturing a pixel according to an embodiment of the inventive concept.

Referring to FIG. 6, a partition wall layer BR is provided on a first substrate SUB1 and a first electrode E1 is provided on a first substrate SUB1 to cover a partition wall layer BR. An insulation layer IL may be provided on the first substrate SUB1 to cover the first electrode E1. A conductive layer CL may be provided on the insulation layer IL.

The insulation layer IL may include the same material as the partition wall insulation layer BRI, and the conductive layer CL may include the same material as the second electrode E2. The insulation layer IL may be provided on the first substrate SUB1 to form the partition wall insulation layer BRI, and the conductive layer CL may be provided on the insulation layer IL to form the second electrode E2.

The first photoresist pattern PR1 may be provided on the conductive layer CL. The first photoresist pattern PR1 may be disposed in an area for forming the partition wall insulation layer BRI and the second electrode E2. For example, a photoresist (or a photosensitive resin) may be provided on the conductive layer CL. Thereafter, the photoresist around the area for forming the partition wall insulation layer BRI and the second electrode E2 is exposed and developed and removed so that the first photoresist pattern PR1 is provided on the conductive layer CL.

Figure 7:
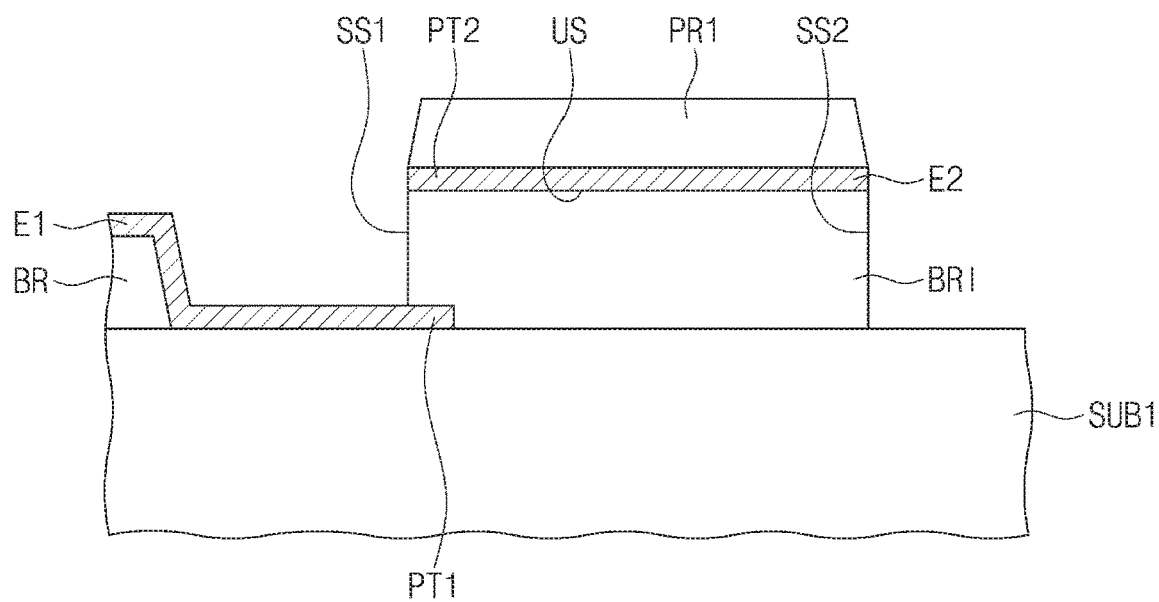
Figure 8:
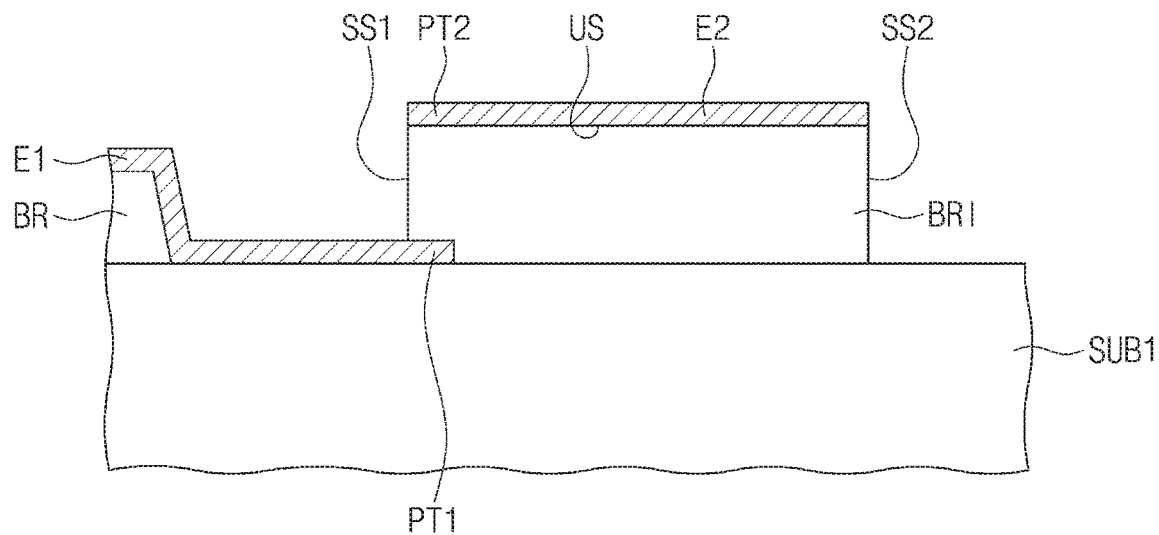

Referring to FIGS. 7 and 8, the conductive layer CL and the insulation layer CL2 around the area for forming the partition wall insulation layer BRI and the second electrode E2 may be removed using the first photoresist pattern PR1 as a mask. Accordingly, a partition wall insulation layer BRI and a second electrode E2 may be provided on the first substrate SUB1.

The partition wall insulation layer BRI may be disposed on the first substrate SUB1 to cover the first portion PT1, and the second electrode E2 may be disposed on the upper surface US of the partition wall insulation layer BRI. After the partition wall insulation layer BRI and the second electrode E2 are formed, the first photoresist pattern PR1 may be removed.

Figure 9:
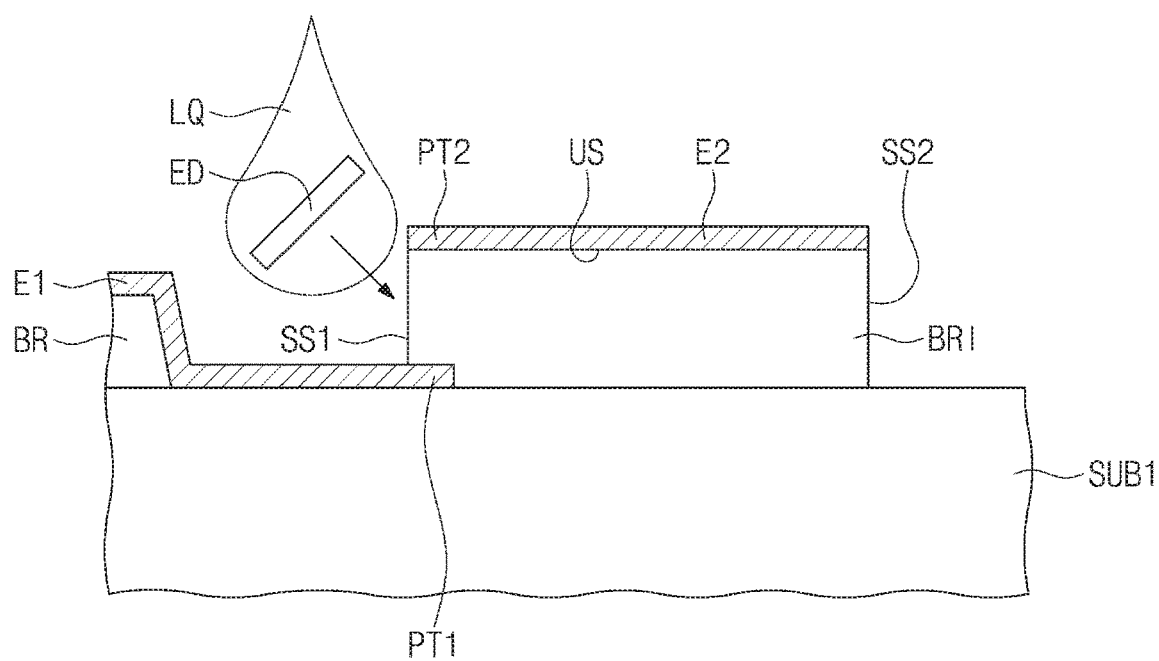
Figure 10:
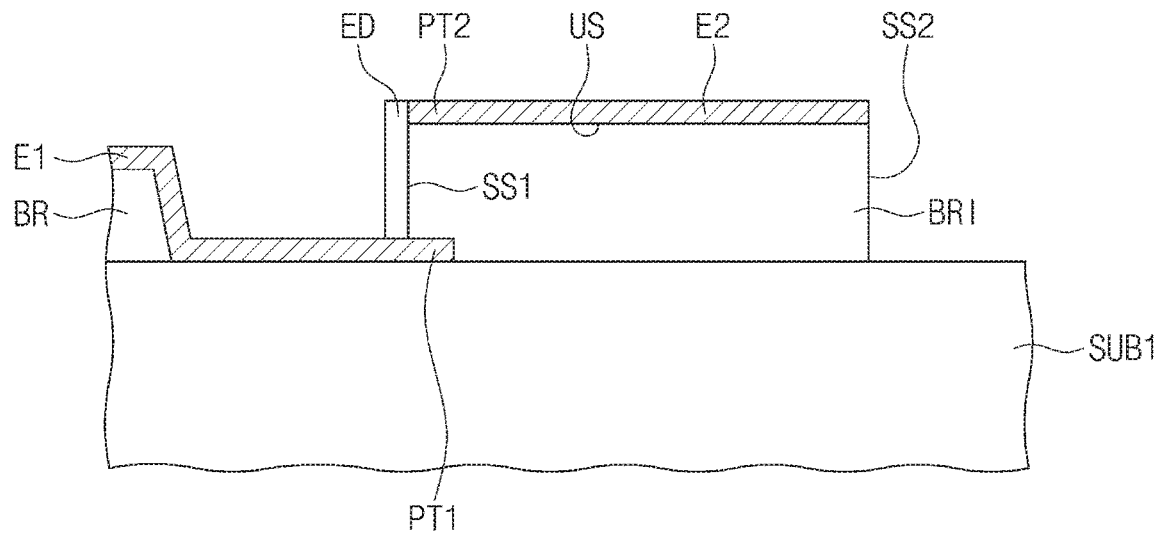

Referring to FIGS. 9 and 10, a light emitting element ED may be provided on the first substrate SUB1. For example, a solution LQ containing a light emitting element ED may be provided between the partition wall layer BR and the partition wall insulation layer BRI. The solution may be ink or paste. The solution LQ may be a substance which may be vaporized at room temperature or by heat.

As voltages of opposite polarities may be applied to the first electrode E1 and the second electrode E2, an electric field may be formed between the first electrode E1 and the second electrode E2. A DC voltage or an AC voltage may be applied to the first electrode E1 and the second electrode E2. Bipolarity is induced in the light emitting element ED by the electric field, and the light emitting element ED may be self-aligned between the first electrode E1 and the second electrode E2 by a dielectrophoretic force.

The second electrode E2 is spaced apart from the first electrode E1 and disposed above the first electrode E1, and the partition wall insulation layer BRI is disposed between the first portion PT1 and the second portion PT2, so that the light emitting element ED may be vertically aligned. A vertically aligned light emitting element ED may be provided on the first side surface SS1 of the partition wall insulation layer BRI.

As described above, the lower end of the light emitting element ED contacts the first electrode E1 to be electrically connected to the first electrode E1, and the upper portion of the light emitting element ED contacts the second electrode E2 to be electrically connected to the second electrode E2.

Figure 11:
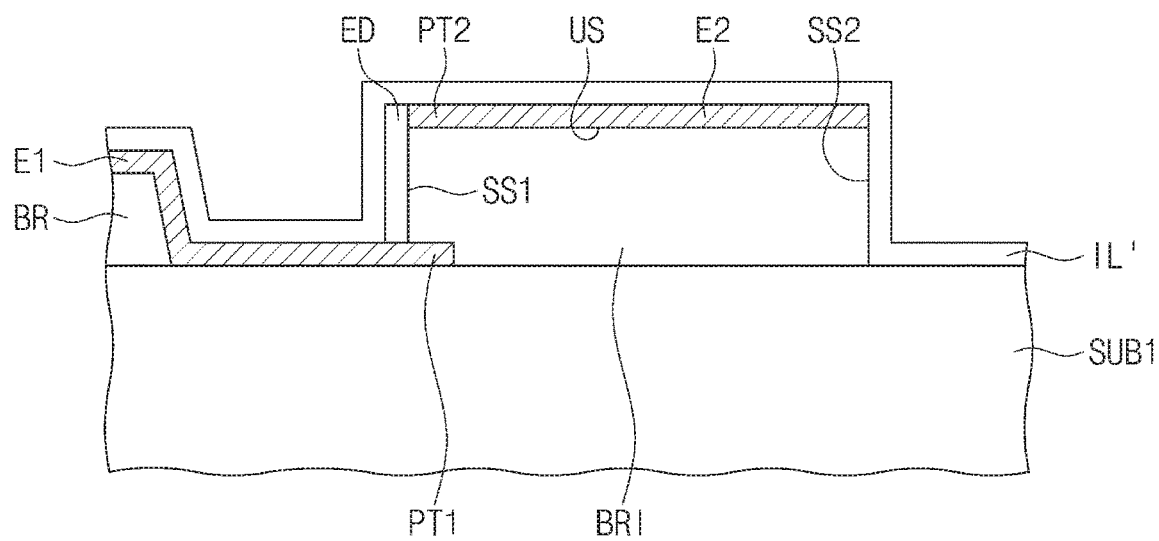

Referring to FIG. 11, an insulation layer IL' may be provided on the first substrate SUB1 to cover the first electrode E1, the second electrode E2, and the light emitting element ED. The insulation layer IL' includes the same material as the fifth insulation layer INS5 and may be provided on the first substrate SUB1 to form the fifth insulation layer INS5.

Figure 12:
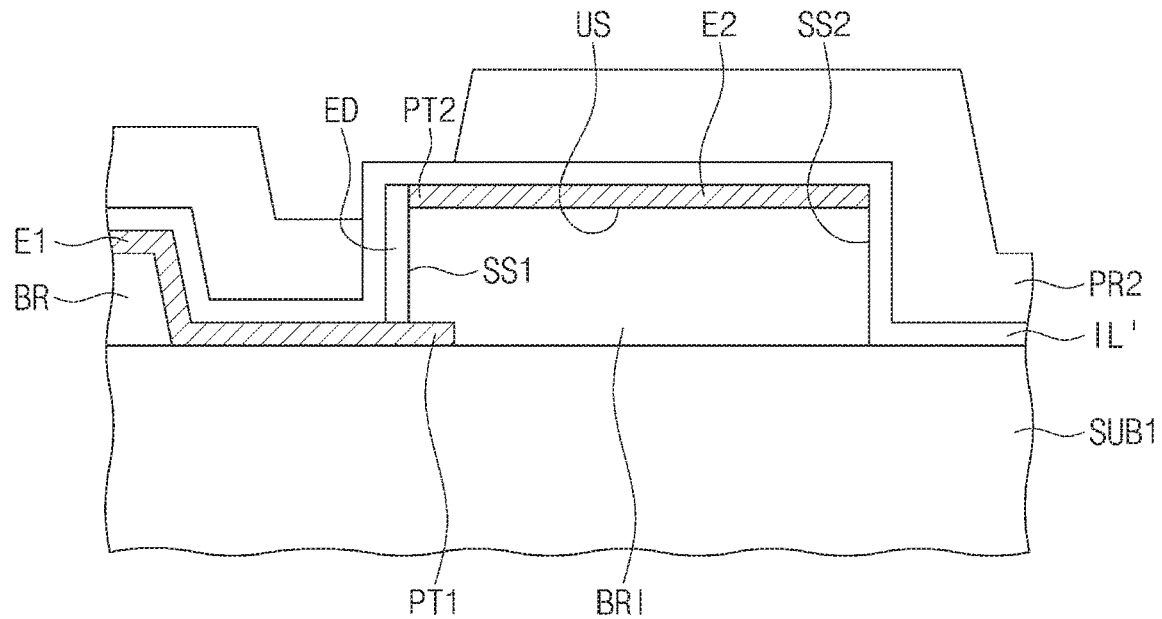

Referring to FIG. 12, a second photoresist pattern PR2 may be provided on the insulation layer IL'. The second photoresist pattern PR2 may be disposed around the area for forming the opening OP. For example, a photoresist is provided on the insulation layer IL', and the photoresist in the area for forming the opening OP is exposed and developed and removed, so that a second photoresist pattern PR2 may be provided on the insulation layer IL'.

Figure 13:
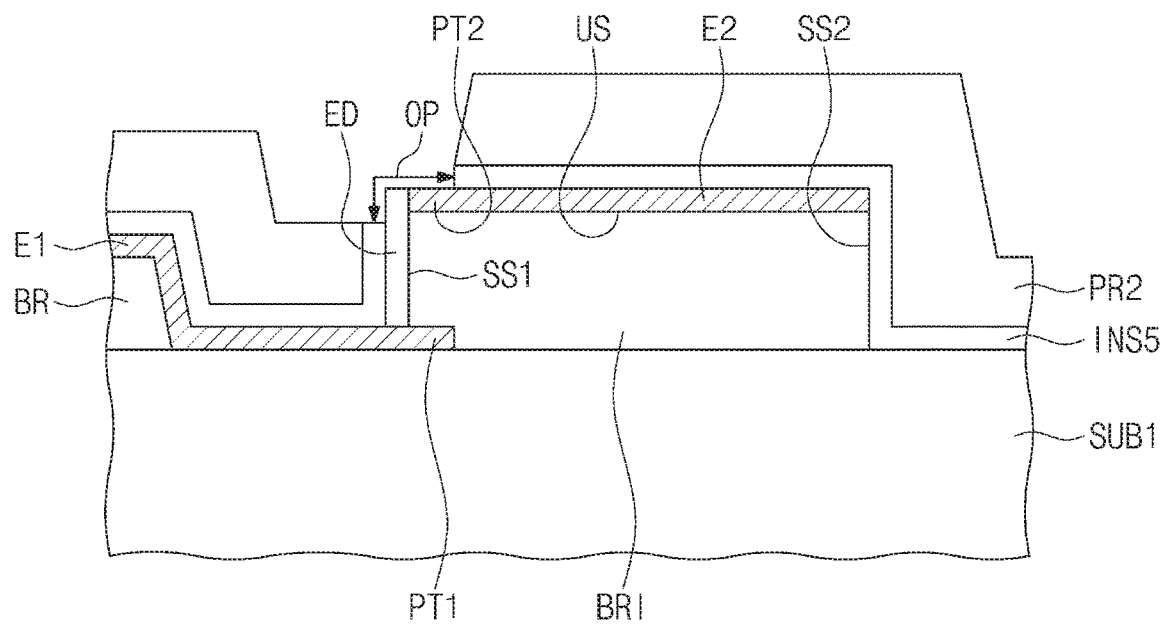
Figure 14:
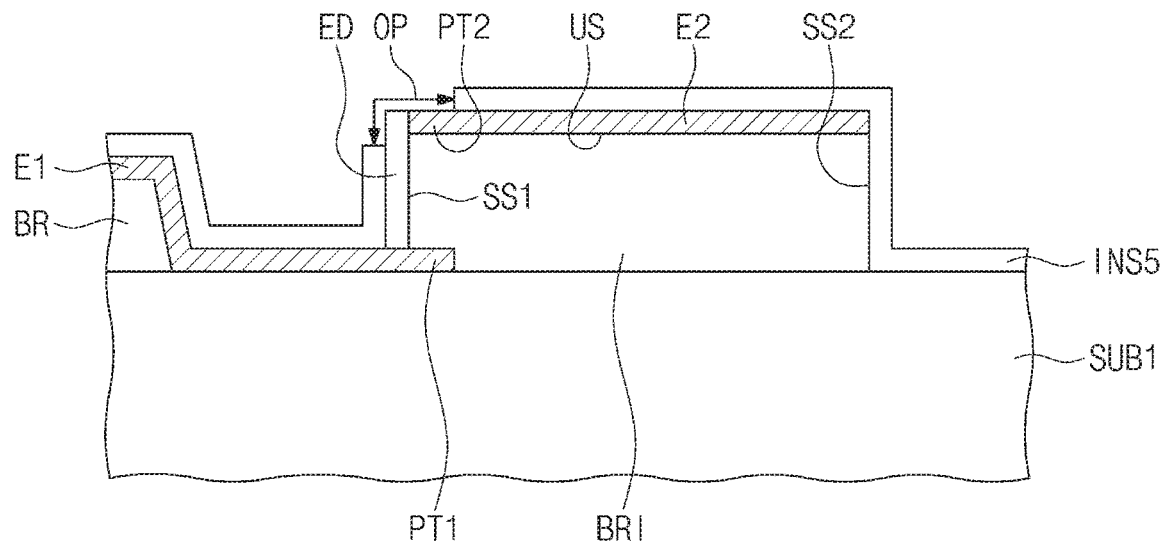

Referring to FIGS. 13 and 14, the insulation layer IL' of the region for forming the opening OP is removed using the second photoresist pattern PR2 as a mask so that a fifth insulation layer INS5 where an opening OP is defined may be provided on the first substrate SUB1. The upper portion and second portions PT2 of the light emitting element ED may be exposed by opening OP. After the fifth insulation layer INS5 is formed, the second photoresist pattern PR2 may be removed.

Figure 15:
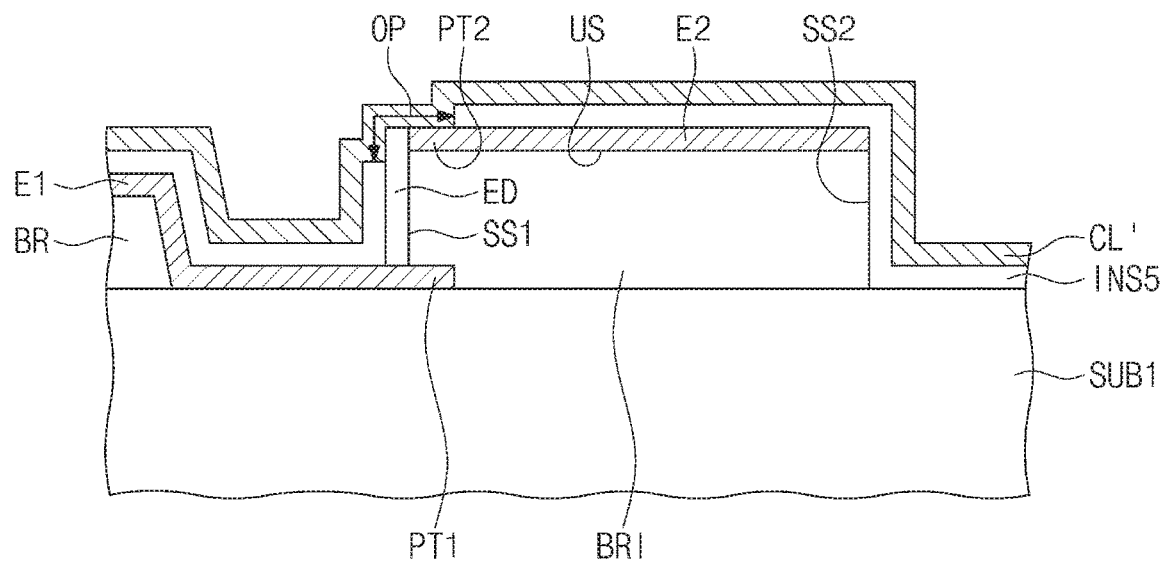

Referring to FIG. 15, a conductive layer CL' may be provided on the opening OP and provided on the fifth insulation layer INS5. The conductive layer CL' includes the same material as the contact electrode CE and may be provided on the first substrate SUB1 to form the contact electrode CE.

Figure 16:
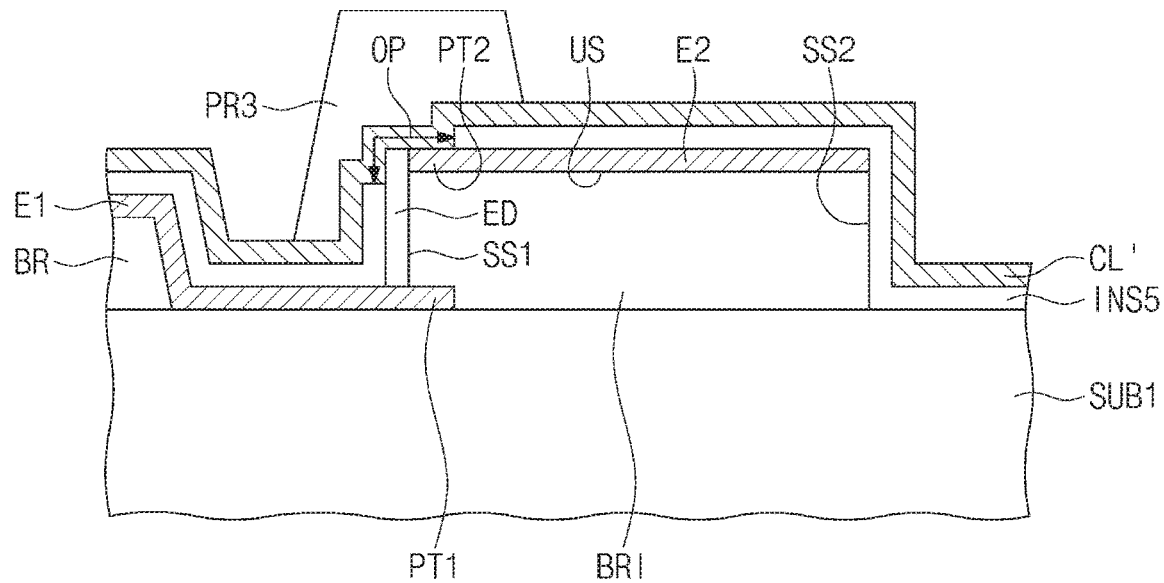

Referring to FIG. 16, a third photoresist pattern PR3 may be provided on the conductive layer CL'. The third photoresist pattern PR3 may be disposed so as to overlap the opening OP and an area adjacent to the opening OP. For example, a photoresist is provided on the conductive layer CL', and the photoresist around the area for forming the contact electrode CE is exposed, developed and removed, so that a third photoresist pattern PR3 may be provided on the conductive layer CL'.

Figure 17:
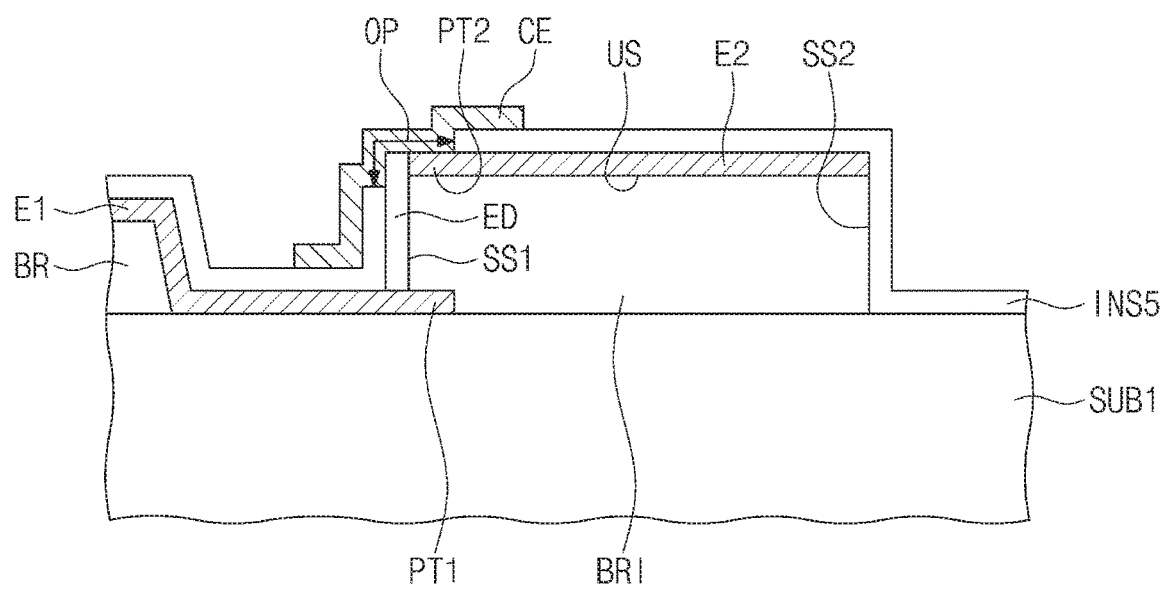
Figure 18:
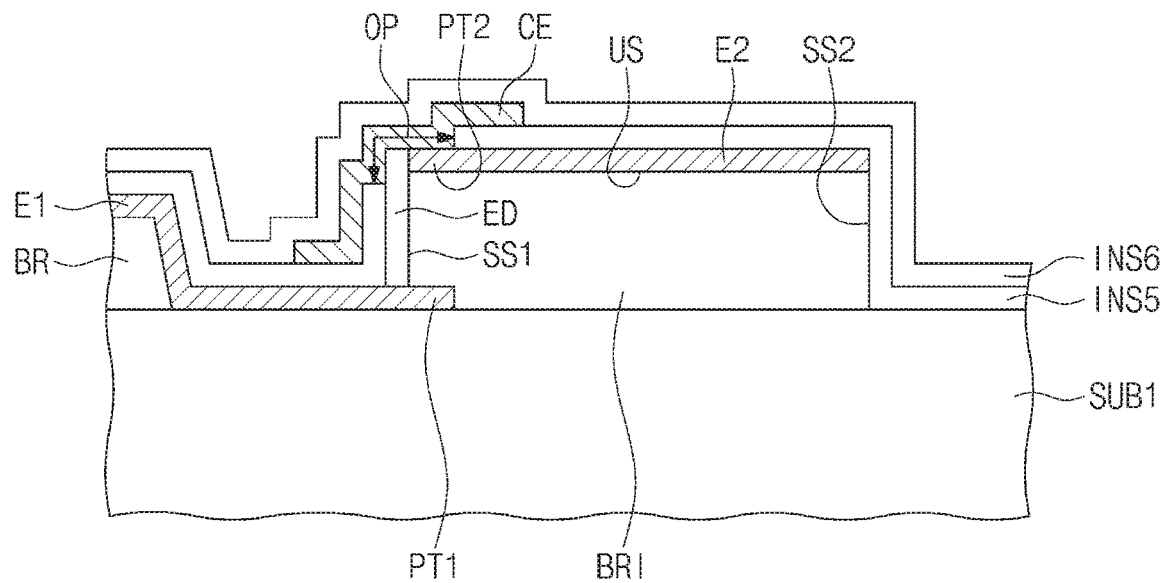

Referring to FIGS. 17 and 18, the conductive layer CL' around the area for forming the contact electrode CE is removed using the third photoresist pattern PR3 as a mask, so that a contact electrode CE may be provided on the first substrate SUB1. A contact electrode CE may be provided at the opening OP to contact the upper portion and second portions PT2 of the light emitting element ED.

After the contact electrode CE is formed, the third photoresist pattern PR3 may be removed, and a sixth insulation layer INS6 may be disposed on the fifth insulation layer INS5 to cover the contact electrode CE.

Although not shown in the drawing, thereafter, the second substrate SUB2 may be disposed on the first substrate SUB1, and the seventh insulation layer INS7 may be disposed between the first substrate SUB1 and the second substrate SUB2.

According to a method of manufacturing a pixel according to an embodiment of the inventive concept, the light emitting element ED may be vertically arranged and connected to the first and second electrodes E1 and E2. As a result, the arrangement area of the light emitting element ED may be reduced, and a larger number of light emitting elements ED may be provided to the display device DD, so that a high resolution of the display device DD may be realized.

Figure 19:
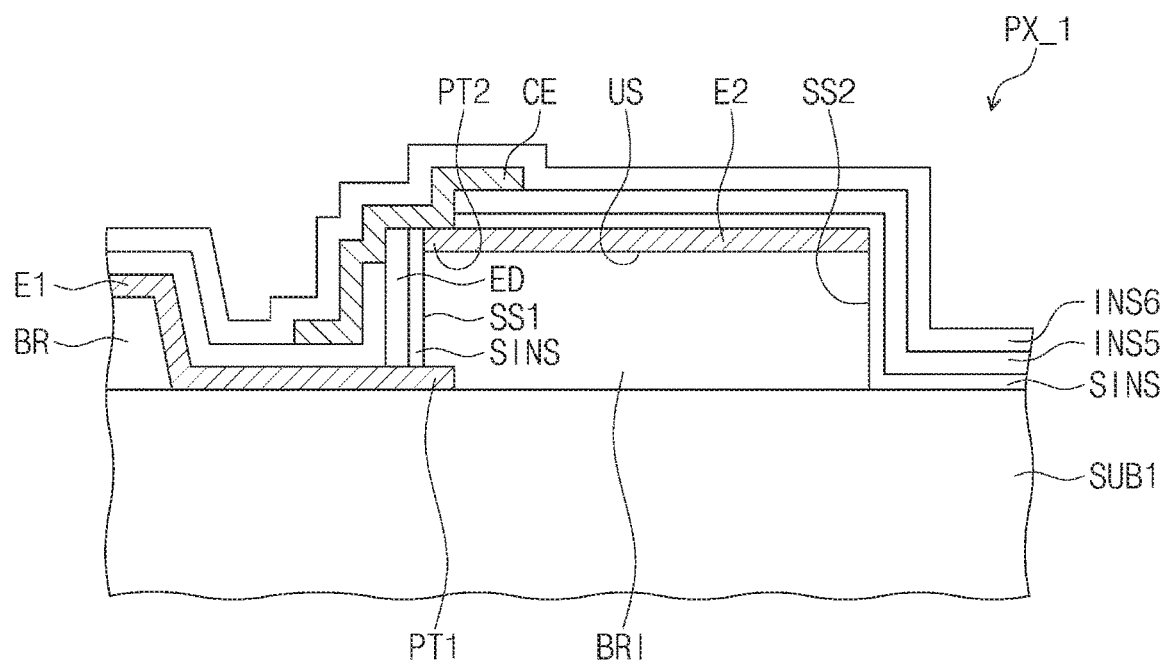
FIG. 19 is a cross-sectional view of a pixel according to another embodiment of the inventive concept.

FIG. 19 is a cross-sectional view of a pixel according to another embodiment of the inventive concept.

For convenience of explanation, the pixel PX_1 shown in FIG. 19 is shown in a cross-sectional view corresponding to the cross-section shown in FIG. 18. Therefore, a cross section of a part of the configuration of the pixel PX_1 is shown, and the other configurations are omitted.

Except for the addition of sub insulation layer SINS, substantially, the pixel PX_1 may have the same configuration as the pixel PX shown in FIG. 5. Therefore, the sub insulation layer SINS will be described below, and the like elements refer to like reference numerals.

Referring to FIG. 19, a sub insulation layer SINS may be disposed between a light emitting element ED and a partition wall insulation layer BRI and between a light emitting element ED and a second portion PT2. In addition, the sub insulation layer SINS is disposed between the fifth insulation layer INS5 and the second electrode E2, between the fifth insulation layer INS5 and the second side surface SS2, and between the fifth insulation layer INS5 and the first substrate SUB1.

The sub insulation layer SINS may include an inorganic material. The fifth insulation layer INS5 may protect the second electrode E2, and additionally, the sub insulation layer SINS is disposed on the side surface of the second portion PT2 and on the second electrode E2, so that the second electrode E2 may be further protected.

The upper portion of the light emitting element ED is insulated from the second portion PT2 by the sub insulation layer SINS, and the light emitting element ED may be electrically connected to the second portion PT2 by the contact electrode CE.

Figure 20:
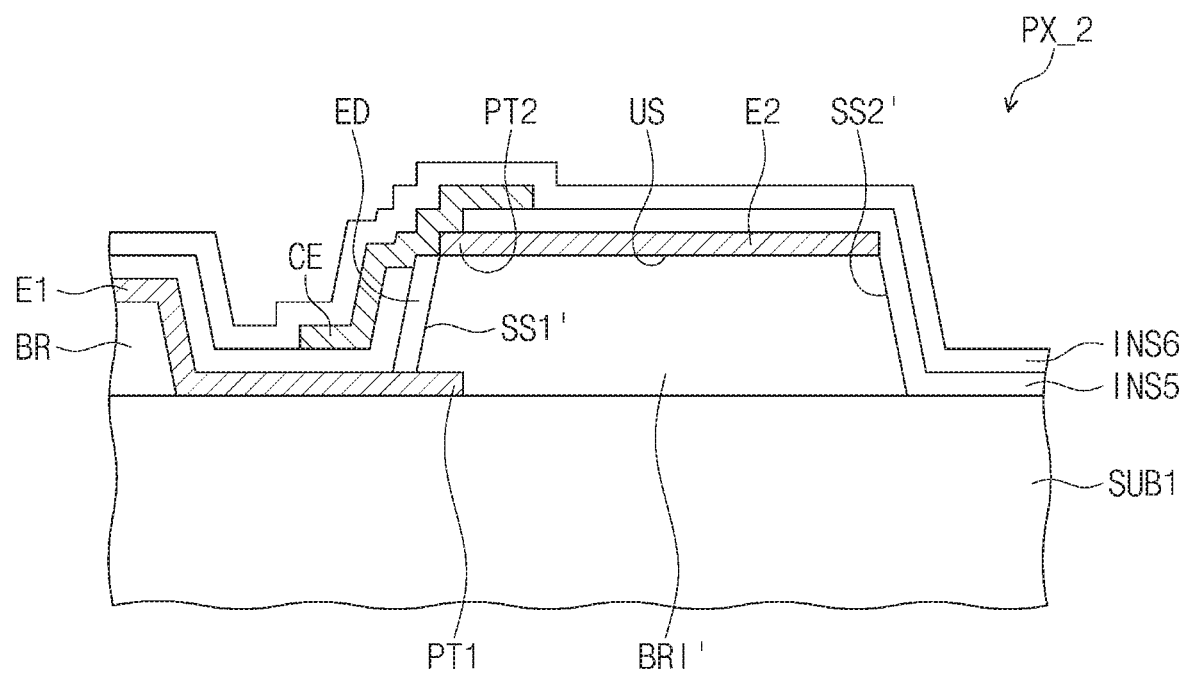
FIG. 20 is a cross-sectional view of a pixel according to another embodiment of the inventive concept.

FIG. 20 is a cross-sectional view of a pixel according to another embodiment of the inventive concept.

For convenience of explanation, the pixel PX_2 shown in FIG. 20 is shown in a cross-sectional view corresponding to the cross-section shown in FIG. 18. Therefore, a cross section of a part of the configuration of the pixel PX_2 is shown, and the other configurations are omitted.

Except for the first and second side surfaces SS1' and SS2' of the partition wall insulation layer BRI', substantially, the pixel PX_2 may have the same configuration as the pixel PX shown in FIG. 5. Accordingly, the first and second side surfaces SS1' and SS2' of the partition wall insulation layer BRI' will be described, and like elements refer to like reference numerals.

Referring to FIG. 20, the cross section of the partition wall insulation layer BRI' may have a trapezoidal shape. Therefore, unlike the first and second side surfaces SS1 and SS2 shown in FIG. 5, the first and second side surfaces SS1' and SS2' of the partition wall insulation layer BRI' may be inclined surfaces having a predetermined inclination angle with the upper surface of the first substrate SUB1. Illustratively, the inclination angle may be less than 90 degrees and greater than 0 degrees, and may be preferably less than 90 degrees and greater than or equal to 45 degrees.

The light emitting element ED may be disposed on the first side surface SS1' having an inclined surface to be electrically connected to the first electrode E1 and the second electrode E2.

According to an embodiment of the inventive concept, since the light emitting elements of the pixels are vertically arranged and connected to the first electrode and the second electrode, the arrangement area of the light emitting element may be reduced. Therefore, the display device including the pixels according to an embodiment of the inventive concept may realize high resolution.

Although the exemplary embodiments of the inventive concept have been described, it is understood that the inventive concept should not be limited to these exemplary embodiments but various changes and modifications may be made by one ordinary skilled in the art within the spirit and scope of the inventive concept as hereinafter claimed.

What is claimed is:

1. A pixel comprising:
   a substrate;
   a first electrode disposed on the substrate;
   a partition wall insulation layer disposed on the substrate to cover a first portion of the first electrode;
   a second electrode disposed on the partition wall insulation layer and including a second portion overlapping the first portion; and
   a light emitting element disposed on a first side surface of the partition wall insulation layer between the first portion and the second portion and connected to the first electrode and the second electrode, wherein a portion of the first electrode that overlaps the light emitting element does not overlap the second electrode in thickness direction.

2. The pixel of claim 1, further comprising a partition wall layer disposed between the substrate and the first electrode, wherein the first electrode is disposed on the substrate to cover the partition wall layer.

3. The pixel of claim 1, wherein a section of the partition wall insulation layer has a rectangular shape.

4. The pixel of claim 1, wherein the first electrode comprises:
   a first extension part extending in a first direction; and
   a plurality of first branch parts branched in a second direction intersecting the first direction from the first extension part,
   wherein the second electrode comprises:
      a second extension part extending in the first direction; and
      at least one second branch part branched in the second direction from the second extension part, and disposed between the first branch parts.

5. The pixel of claim 4, wherein the first portion comprises:
   each side of the first branch parts adjacent to one of two sides of the second branch part, the two sides of the second branch part opposite to each other in the first direction; and
   predetermined portions of the first branch parts adjacent to each side of the first branch parts,
   wherein the second portion comprises:
      the two sides of the second branch part; and
      predetermined portions of the second branch part adjacent to the two sides of the second branch part.

6. The pixel of claim 1, wherein the partition wall insulation layer comprises an inorganic material.

7. The pixel of claim 1, wherein the first electrode comprises a reflective electrode.

8. The pixel of claim 7, wherein the first electrode further comprises a transparent electrode disposed on the reflective electrode.

9. The pixel of claim 1, wherein a lower end of the light emitting element contacts the first electrode, and
   wherein a side surface of an upper portion of the light emitting element, which is defined as a predetermined portion of the light emitting element adjacent to an upper end of the light emitting element, contacts the second portion.

10. The pixel of claim 9, further comprising an insulation layer disposed on the first electrode, the second electrode, and the light emitting element, and having a defined opening exposing the upper portion and the second portion of the light emitting element.

11. The pixel of claim 10, further comprising a contact electrode disposed in the opening and contacting the upper portion of the light emitting element and the second electrode.

12. The pixel of claim 11, further comprising a sub insulation layer disposed between the light emitting element and the partition wall insulation layer, between the light emitting element and the second portion, between the insulation layer and a second electrode, and between the insulation layer and a second side surface of the partition wall insulation layer defined as a side surface of the partition wall insulation layer excluding the first side surface.

13. The pixel of claim 1, wherein the first side surface is inclined surface that makes a predetermined inclination angle with respect to an upper surface of the substrate.

14. A pixel comprising:
   a substrate;
   a first electrode disposed on the substrate;
   a partition wall insulation layer disposed on the substrate to cover a first portion of the first electrode;
   a second electrode disposed on the partition wall insulation layer and including a second portion overlapping the first portion; and
   a light emitting element disposed on a first side surface of the partition wall insulation layer between the first portion and the second portion, connected to the first electrode and the second electrode, having a cylindrical shape, and vertically arranged in a direction intersecting an upper surface of the substrate.

15. A display device comprising a plurality of pixels, wherein each of the plurality of pixels comprises:
   a substrate;
   a first electrode disposed on the substrate;

a partition wall insulation layer disposed on the substrate to cover a first portion of the first electrode;

a second electrode disposed on the partition wall insulation layer and including a second portion overlapping the first portion; and a light emitting element disposed on a first side surface of the partition wall insulation layer between the first portion and the second portion and connected to the first electrode and the second electrode, wherein a portion of the first electrode that overlaps the light emitting element does not overlap the second electrode in thickness direction.

\* \* \* \* \*